US012813019B2

(12) United States Patent
Zhang et al.

(10) Patent No.: US 12,813,019 B2
(45) Date of Patent: Nov. 24, 2026

(54) SUBSTRATE STRUCTURE FOR LIGHT-EMITTING DIODES AND METHOD OF MAKING THE SAME

(71) Applicant: BOLB INC., Livermore, CA (US)

(72) Inventors: Jianping Zhang, Livermore, CA (US); Ying Gao, Livermore, CA (US); Bin Zhang, Livermore, CA (US); Ling Zhou, Livermore, CA (US)

(73) Assignee: BOLB INC., Livermore, CA (US)

( * ) Notice: Subject to any disclaimer, the term of this patent is extended or adjusted under 35 U.S.C. 154(b) by 891 days.

(21) Appl. No.: 17/965,691

(22) Filed: Oct. 13, 2022

(65) Prior Publication Data

US 2024/0128405 A1 Apr. 18, 2024

(51) Int. Cl.

| | |
|---|---|
| ***H10H 20/825*** | (2025.01) |
| ***H10H 20/01*** | (2025.01) |
| ***H10W 90/00*** | (2026.01) |

(52) U.S. Cl.

CPC .... *H10H 20/825* (2025.01); *H10H 20/01335* (2025.01); *H10W 90/00* (2026.01)

(58) Field of Classification Search

None

See application file for complete search history.

(56) References Cited

U.S. PATENT DOCUMENTS

| | | | | |
|---|---|---|---|---|
| 4,855,249 | A | 8/1989 | Akasaki | |
| 7,811,847 | B2 | 10/2010 | Hirayama | |
| 9,614,214 | B2 | 4/2017 | Lee | |
| 9,680,056 | B1 | 6/2017 | Zhang | |
| 2010/0323506 | A1 * | 12/2010 | Cheng | H01L 21/02458 438/102 |
| 2013/0069079 | A1 * | 3/2013 | Kim | H01L 21/02458 438/479 |
| 2019/0355571 | A1 * | 11/2019 | Yoshikawa | H10F 30/21 |
| 2021/0193863 | A1 * | 6/2021 | Wildeson | H01L 21/02647 |

OTHER PUBLICATIONS

"Effect of Nature of Surfaces on Wetting of Sapphire by Liquid Aluminum", J. J. Brennan and J. A. Pask, Journal of the American Ceramic Society, vol. 51, No. 10, 569-573 (1968).

* cited by examiner

*Primary Examiner* — Alexander G Ghyka

(74) *Attorney, Agent, or Firm* — J.C. PATENTS

(57) ABSTRACT

A substrate structure includes an AlN template layer formed on a substrate. Depressions sealed by the AlN template layer are formed on a surface of the substrate at an interface between the substrate and the AlN template layer, the sealed depressions contain discrete depressions and depression networks and have a lateral size in the range of 20-100 nm, a vertical dimension in the range of 20-100 nm, and a density in the range of $1.0\times10^{9}$-$2.0\times10^{10}$ $cm^{-2}$. The substrate structure is used for light-emitting diodes with improved optical output power efficiency.

12 Claims, 13 Drawing Sheets s1 s2 s3 s1 s2

SUBSTRATE STRUCTURE FOR LIGHT-EMITTING DIODES AND METHOD OF MAKING THE SAME

FIELD OF THE INVENTION

The present disclosure relates to a substrate structure having a template layer and a substrate, and group-III nitride semiconductor template layer formation on a substrate, particularly, to aluminum nitride (AlN) layer formation on sapphire substrate used for light-emitting diodes with improved optical output power efficiency.

DESCRIPTION OF THE RELATED ART

Ultraviolet (UV) light-emitting diodes (LEDs) with optical emission wavelengths less than 360 nm are made of group-III nitride compound semiconductors such as AlGaN alloys. A typical UV LED includes a UV transparent sapphire substrate and an AlN layer formed on the substrate. This AlN layer serves as an epitaxial template to support a light-emitting structure, which typically includes an n-type AlGaN structure, a p-type AlGaN structure, and a light-emitting structure commonly made of AlGaN multiple-quantum-well (MQW) sandwiched in-between the n-type and p-type AlGaN structures. An AlGaN structure can be made of an AlGaN layer or many AlGaN layers joint forces to deliver a better function, such as to improve material quality, conductivity and/or carrier confinement. The Al-contents in the AlGaN layers/structures determines the optical emission wavelength of the LEDs. The optical emissions of wavelength less than 280 nm possess strong germicidal effect, making them ideal for food, water, air and surface disinfections.

On the one hand, the defect density, especially the density of the extended defects, in the light-emitting structure of UV LEDs is largely determined by the AlN template layer. Therefore, the quality of the AlN layer is critical to the efficiency and reliability of UV LEDs. On the other hand, the UV LEDs' light extraction efficiency is also affected by the AlN/sapphire interface smoothness. Smooth AlN/sapphire interface can only allow for transmission of rays with incident angle less than a total internal reflection angle, while roughened AlN/sapphire interface can interrupt the total internal reflection, promising for better light extraction efficiency.

To reduce defect density in $Al_xGa_{1-x}N$ ($0 \leq x < 1$) layers formed over a sapphire substrate, in the past, a low-temperature deposited non-single-crystalline AlN buffer was used (U.S. Pat. No. 4,855,249). However, so-formed AlN and $Al_xGa_{1-x}N$ layers usually are subjected to high-density (~$10^{10}$ $cm^{-2}$) defects such as dislocations. A modified AlN growth technique to alternatively stack pulsed and continuous ammonia supply grown AlN layers has been disclosed in the U.S. Pat. No. 7,811,847. U.S. Pat. No. 9,680,056 has also reported a heavily Si-doped strain-management AlN interlayer to improve AlN quality on sapphire substrate. Further, a high-temperature annealing process was developed for AlN layer on sapphire, as seen in U.S. Pat. No. 9,614,214. This process requires multiple steps including depositing AlN on sapphire in one reactor and annealing the so-formed AlN layer in another reactor, as the annealing temperature required to reduce defect density in the AlN layer is more than 1600° C., even more than 1700° C.

In this disclosure, we disclose a substrate structure for light-emitting diodes with improved material quality and better light extraction, and a method to form the same. The substrate structure contains one or more AlN layers grown on a substrate such as a sapphire substrate

SUMMARY OF THE INVENTION

A first aspect of the disclosure provides a substrate structure for light emitting diodes, which includes a substrate and an AlN template layer formed on a surface of the substrate, wherein sealed depressions are formed on the surface of the substrate and covered by the AlN template layer, the sealed depressions contain discrete depressions and depression networks.

The sealed depressions may have a lateral size in the range of 20-100 nm, a vertical dimension in the range of 20-100 nm, and a density in the range of $1.0 \times 10^9$-$2.0 \times 10^{10}$ $cm^{-2}$.

The sealed depressions can be formed by:

forming discrete AlN nuclei on the surface of the substrate;

growing the discrete AlN nuclei into discrete AlN nucleation islands and simultaneously etching, with the discrete AlN nuclei and the discrete AlN nucleation islands functioning as mask, the surface of the substrate to form depressions on the surface of the substrate; and under a growth condition favoring two-dimensional growth, growing the discrete AlN nucleation islands to coalesce the AlN nucleation islands, forming the AlN template layer and turning the depressions into the sealed depressions.

A second aspect of this disclosure provides a manufacturing method of a substrate structure for light emitting diodes, which includes:

providing a sapphire substrate; forming discrete AlN nuclei on a surface of the substrate and providing uncovered surface area of the substrate, the uncovered surface area is not covered by the discrete AlN nuclei, wherein the AlN nuclei have a size in the range of 1-10 nm, a thickness in the range of 10.0-25.0 Å, and a density in the range of $10^9$-$10^{12}$ $cm^{-2}$; growing the AlN nuclei into AlN nucleation islands, and simultaneously etching the uncovered surface area of the substrate to form depressions on the surface of the substrate in-between the AlN nucleation islands; and under a condition favoring lateral growth, growing the AlN nucleation islands, making the AlN nucleation islands coalesce to form an AlN template layer, wherein the coalescence of the AlN nucleation islands seals the depressions, forming sealed depressions which contain discrete depressions and depression networks.

A third aspect of this disclosure provides a light emitting diode, which includes a substrate structure of the above first aspect; a n-type structure formed on the AlN template layer of the substrate structure; an active region formed on the n-type structure, and a p-type structure formed on the active region.

BRIEF DESCRIPTION OF THE DRAWINGS

The accompanying drawings, which are included to provide a further understanding of the invention and constitute a part of this application, illustrate embodiments of the invention and together with the description serve to explain the principle of the invention. Like reference numbers in the figures refer to like elements throughout, and a layer can refer to a group of layers associated with the same function.

DETAILED DESCRIPTION OF EMBODIMENTS

Figure 1A:
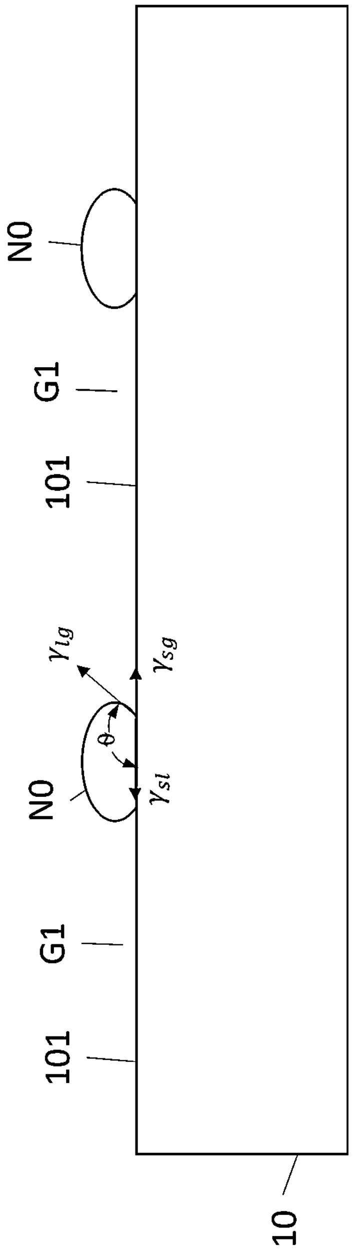
FIG. 1A illustrates non-wetting Al nuclei formation on a sapphire substrate.

Throughout the specification, the term group III nitride in general refers to metal nitride with cations selecting from group IIIA of the periodic table of the elements. That is to say, III-nitride includes AlN, GaN, InN and their ternary (AlGaN, InGaN, InAlN) and quaternary (AlInGaN) alloys. In this specification, a quaternary can be reduced to a ternary for simplicity if one of the group III elements is significantly small so that its existence does not affect the intended function of a layer made of such material. For example, if the In-composition in a quaternary AlInGaN is significantly small, smaller than 1%, then this AlInGaN quaternary can be shown as ternary AlGaN for simplicity. Using the same logic, a ternary can be reduced to a binary for simplicity if one of the group III elements is significantly small. For example, if the In-composition in a ternary InGaN is significantly small, smaller than 1%, then this InGaN ternary can be shown as binary GaN for simplicity. Group III nitride may also include small amount of transition metal nitride such as TiN, ZrN, HfN with molar fraction not larger than 10%. For example, III-nitride or nitride may include $Al_xIn_yGa_zTi_{(1-x-y-z)}N$, $Al_xIn_yGa_zZr_{(1-x-y-z)}N$, $Al_xIn_yGa_zHf_{(1-x-y-z)}N$, with $(1-x-y-z) \leq 10\%$.

As well known, blue, green and UV light-emitting devices such as light-emitting diodes (LEDs) commonly adopt a light-emitting structure containing a quantum well active region, an n-type group III nitride structure for injecting electrons into the active region, and a p-type group III nitride structure on the other side of the active region for injecting holes into the active region. This light-emitting structure is generally formed over a transparent substrate. Even though the substrate can be selected from silicon carbide (SiC), AlN and sapphire, in consideration of cost, commercial viability and UV transparency, sapphire, usually c-plane sapphire is the number one choice of selection for visible and UV LEDs. A c-plane sapphire substrate has a (0002) plane to receive epitaxial growth layers.

Group-III nitrides and sapphire, however, possess large lattice constant difference in c-plane (~14%). During epitaxial growth, the lattice constant difference can be accommodated and accumulated as lattice elastic energy, which will relax upon certain level to generate large amount of crystal defects. For UV LEDs, an AlN layer is generally formed on the sapphire substrate to provide epitaxial template for the following LED structure. This AlN layer is thus referred to as a template layer, and it is of critical importance to obtain high-quality AlN template layer on a substrate such as sapphire substrate.

According to one aspect of the present disclosure, to accommodate a large lattice-constant difference between a template layer and a substrate, the surface of the substrate to receive the template layer is preferred to possess high-density pits/depressions. These depressions can be of sub-micron size, for example, 20-100 nm, and of high areal density, such as $10^9$-$10^{12}$ $cm^{-2}$, e.g., $10^{10}$ $cm^{-2}$. The depth of the depressions can be in the range of 20-200 nm, e.g., 20-100 nm. According to another aspect of the present disclosure, these substrate surface depressions are optionally formed during the formation process of the template layer. The depression formation process is as follows. The first step is to form discrete nuclei of the template layer on the surface of the substrate. These nuclei are optionally made of the same material as the template layer and separated from each other. These nuclei may spread all over the substrate surface and cover a portion of the substrate surface. The uncovered portion of the substrate surface is preserved as the substrate surface without modifications, or without modifications that change the nature of the substrate surface. The second step is to grow these nuclei into nucleation islands, and simultaneously etch the uncovered portion to form depressions on the substrate surface in-between and around the nucleation islands. In this process, the discrete nuclei and the nucleation islands also function as a mask for etching the uncovered sections of the substrate surface. The depressions on the substrate surface are formed in-between and around the nucleation islands and, thus, some of the depressions may become connected to each other forming depression networks and some are formed as discrete depressions separated from each other. To form the discrete depressions and/or depression networks, substances or elements that can react with the substrate material and form volatile products are applied during the formation of the nucleation islands. The third step is to enhance lateral growth rate (via two-dimensional growth mode) of the nucleation islands, making neighboring nucleation islands coalesce to form a smooth and continuous template layer on the substrate. During the coalescence process of the nucleation islands, the depressions of the substrate can be sealed and turned into sealed depressions, i.e., the depressions are covered by the continuous template layer, and optionally a first set of voids can be formed in the template layer. As such, the sealed depressions may contain sealed discrete depressions and sealed depression networks. Some of the sealed depressions are fully filled by the material generated in the coalescence process of the nucleation islands, some of the sealed depressions are partially filled by the material generated in the coalescence process and partially contain voids, and some of the sealed depressions fully contain voids. Furthermore, a second set of voids can be formed in the template layer following the first set of voids via a growth mode change from three-dimensional to two-dimensional growth at a roughened growth front/surface. A three-dimensional growth mode usually enhances vertical growth rate, i.e., the growth rate in the direction perpendicular to the substrate surface, and a two-dimensional growth mode usually enhances lateral growth rate, i.e., the growth rate in directions in parallel to the substrate surface. Three-dimensional growth mode usually results in roughened growth surface while two-dimensional growth mode leads to smooth growth surface.

Taking AlN template layer as an example, according to one aspect of the present disclosure, it is desirable to create free surfaces within the AlN template layer or on the substrate surface. These free surfaces can terminate extended defects such as threading dislocations within the AlN template layer to improve crystal quality. One way to provide such free surfaces is to form high-density submicron depressions on the substrate surface where the AlN template layer is to be deposited on. For this purpose, the density of the free surfaces, hence the density of the depressions, needs to be sufficiently high. This can be achieved via special epitaxial growth procedures to be disclosed in the following. In principle, the growth mechanism can be summarized to include at least three steps. At the beginning of AlN epitaxy growth of the AlN template layer, high-density discrete AlN nuclei (e.g., N1 in FIG. 1C) are formed on a substrate surface such as a sapphire substrate surface, while the remaining complementary surface area uncovered by the discrete AlN nuclei is preferred to be preserved, meaning to remain as sapphire or $Al_2O_3$ surface. The AlN nuclei may have a size in the range of 1-10 nm, a thickness in the range of 10.0-25.0 Å, and a density in the range of $10^9$-$10^{12}$ $cm^{-2}$. The next growth step is to grow the AlN nuclei into AlN nucleation islands (e.g., N2 in FIG. 1D), and simultaneously etch the uncovered surface area to form depressions which may contain discrete depressions and/or depression networks on the substrate surface in-between the AlN nucleation islands. The third step is to enhance lateral growth of the AlN nucleation islands, making neighboring islands coalesce to form a smooth and continuous AlN layer. The coalescence of the AlN nucleation islands usually takes place in the vicinity of the depressions, tending to (even though not guaranteed) form a first set of voids within the AlN template layer above the depressions (e.g., V1 in FIG. 1F). The first set of voids may have a lateral size in the range of 10-100 nm, a vertical size in the range of 10-300 nm, and a density in the range of ~$10^9$-~$10^{10}$ $cm^{-2}$. The coalescence process also seals the depressions which may contain sealed discrete depressions and/or sealed depression networks at the interface between the AlN template layer and the substrate. These so-formed sealed depressions provide free surfaces, able to terminate defects or stop their penetration into the following AlN template layer. Some of the sealed depressions are fully filled by AlN material generated in the coalescence process of the AlN nucleation islands, some of the sealed depressions are partially filled by AlN material generated in the coalescence process of the AlN nucleation islands and partially contain voids, and some of the sealed depressions fully contain voids (being hollow). A free surface means an interface of discontinuity in composing materials when crossing the interface. In this specification, on one side of the free surface there is a solid material and on the other side of the free surface there is a void which can be vacuum or filled with gaseous materials. For example, when the AlN template layer is formed via epitaxy, the epitaxial ambient is usually of vacuum or low pressure (lower than atmosphere pressure) with ambient gases such as hydrogen, nitrogen, and ammonia, then the voids formed in the AlN template layer can be vacuum or filled with low pressure gases including hydrogen, nitrogen and ammonia.

To further improve the AlN layer quality, a fourth step to generate a second set of voids within the AlN template layer can be applied. Usually, the second set of voids has larger size and lower density as compared to the first set of voids. The second set of voids may have a lateral size in the range of 30-100 nm, a vertical size in the range of 100-300 nm, and a density ~$10^9$ $cm^{-2}$, e.g., in the range of $5.0\times10^8$-$5.0\times10^9$ $cm^{-2}$. To generate the second set of voids, a growth procedure to firstly roughen the AlN surface of the AlN template layer and secondly coalesce the roughened AlN surface can be employed. Similarly, two or more sets of such voids can be formed within the AlN template layer.

In most of the embodiments of the present disclosure, the substrates used are made of sapphire. But the same teachings can be applied to substrates made of other materials, such as SiC and silicon (Si).

Figure 1B:
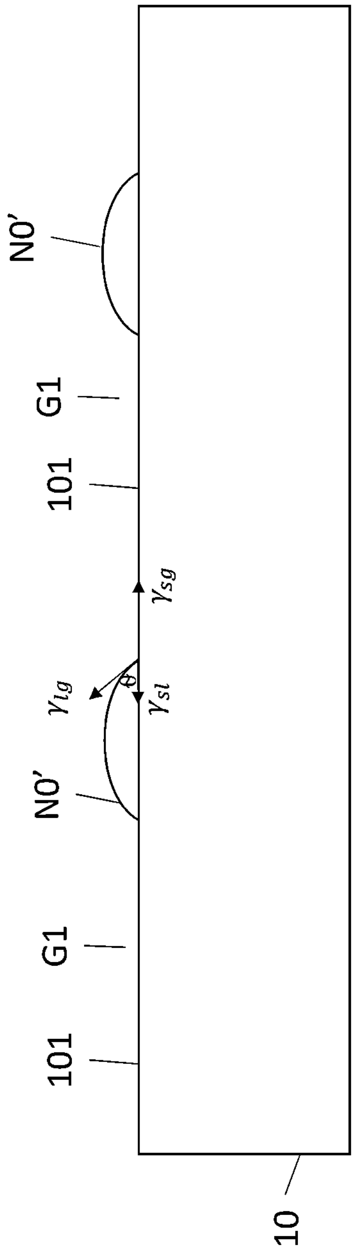
FIG. 1B illustrates wetting Al nuclei formation on a sapphire substrate.

Referring to FIGS. 1A and 1B, a substrate 10, optionally made of sapphire, is provided. Depending on the substrate temperature, wetting or non-wetting aluminum (Al) nuclei can be formed on the substrate surface. For example, there are literature reports to suggest that, for the substrate temperature range of 660-900° C., Al (liquid or molten) can be non-wetting on sapphire surface (e.g., J. J. Brennan and J. A. Pask, Journal of the American Ceramic Society 50, 569 (1968), the content of which is herein incorporated by reference in its entirety). For substrate temperatures above 950° C., liquid Al becomes wetting on sapphire surface. Being wetting or non-wetting of a liquid on a solid surface means the contact angle is acute or obtuse. The contact angle θ, as shown in FIGS. 1A and 1B, is defined by the solid-liquid (sl) and liquid-gas (lg) interfaces intersecting at the contact point where three phases, i.e., solid, gas, and liquid phases concur. Physically, the wetting or non-wetting phenomenon is controlled by the interface tensions. If the solid-liquid interface tension, $\gamma_{sl}$, is larger than the solid-gas interface tension, $\gamma_{sg}$, the contact angle θ will be obtuse and the liquid will be non-wetting on the solid surface. If $\gamma_{s1}<\gamma_{sg}$, the contact angle will be acute and the liquid is wetting on the solid surface.

According to one aspect of the present invention, optionally a pre-step can be applied to form non-wetting discrete Al nuclei N0 on portions of a surface of substrate 10 (shown in FIG. 1A). Optionally, non-wetting discrete Al nuclei N0 are formed on substrate 10. Substrate 10 can be a shape of a wafer, so can also be called as wafer substrate 10. The remaining complementary substrate surface area 101 remains as sapphire or $Al_2O_3$ surface. Al nuclei NO are separated from each other by space gaps G1. The nominal thickness of nuclei N0 is less than 0.8 angstrom (Å), i.e., in the range of 0.2-0.6 Å. This nominal thickness affects the following AlN layer quality hence needs to be experimentally optimized. The nominal thickness used in this specification means a wafer-area-averaged thickness as true thickness may vary from area to area, which is especially true during the nucleation process. Similarly, a nominal growth rate is the ratio of the nominal thickness to the growth time. Then these Al nuclei N0 are converted into AlN nuclei via providing a short pulse of ammonia ($NH_3$) treatment at the same temperature of forming NO nuclei, which is typically in the range of 800-950° C. as measured by a thermal couple in the close vicinity of a wafer carrier which holds and heats up substrate 10. The temperature measured by this thermal couple is supposed to be a true measure of the substrate surface temperature, or within a deviation ~+50° C. In the following, for simplicity, all temperatures mentioned below mean temperatures measured by a thermal couple to the wafer carrier in the close vicinity. The wafer carrier is usually made of graphite and coated with silicon carbide (SiC) or tantalum carbide (TaC). The ammonia short pulse used to convert Al nuclei N0 into AlN nuclei needs to be short and the ammonia flow rate needs to be small such as in the range of 10-20 or 13-17 standard cubic centimeters per minute (sccm), in order to maintain the complementary surface area 101 (uncovered by Al nuclei NO) as sapphire surface, or ensure that the surface area 101 is not significantly converted into AlN. For example, a short pulse of 1-3 seconds (s) of ammonia of flow rate in the range of 10-20 standard cubic centimeters per minute (sccm) can be supplied to the surface of substrate 10.

Figure 1C:
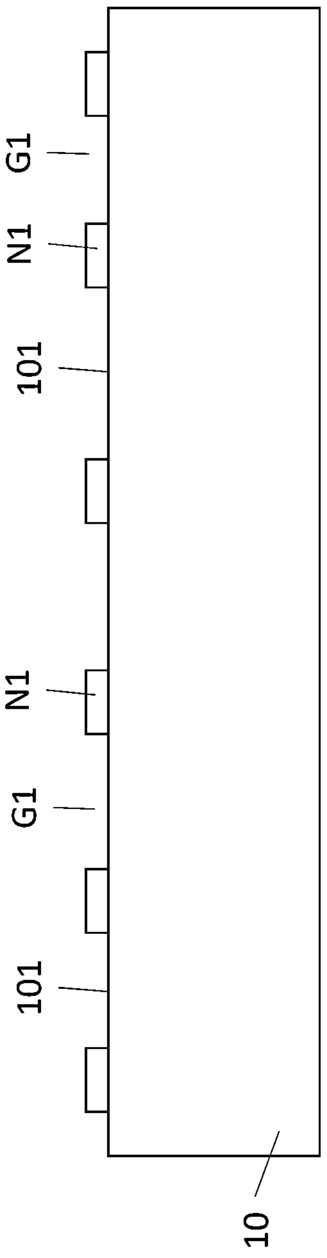
FIG. 1C illustrates AlN nuclei formation and sapphire surface preservation on a sapphire substrate.

Refer to FIG. 1C, after converting Al nuclei N0 into AlN nuclei, there is a need to continue the growth of the AlN nuclei into larger AlN nuclei N1. The growth and/or formation of AlN nuclei N1 is called step 1 or s1 in this specification. As seen, during the formation of AlN nuclei N1, it is critical to maintain the complementary surface area 101 as sapphire surface, or ensure that the surface area 101 is not significantly converted into AlN. As AlN nuclei N1 grow, the surface area 101 may shrink and gaps G1 may shrink in lateral dimensions but grow in vertical dimension. The nominal growth rate of AlN nuclei N1 is optionally in the range of 0.1-0.3 Å/s, and the optional nominal thickness of AlN nuclei N1 is in the range of 10.0-25.0 Å, and the lateral size of the AlN nuclei N1 may be in the range of 1-10 nm. The areal density of AlN nuclei N1 optionally is in the range of $10^9$-$10^{12}$ $cm^{-2}$. During the growth of AlN nuclei N1, Al source (e.g., trimethylaluminum $Al_2(CH_3)_6$, or called as TMA) can be supplied continuously, while nitrogen source (e.g., ammonia) is optionally supplied in pulses. This is to facilitate the proper growth of AlN nuclei N1 while effectively maintain surface area 101 as sapphire surface, or ensure surface area 101 not to be significantly converted into AlN. An example of ammonia pulse supply scheme is given in FIG. 2. As seen, here the Al source is constantly on (though not shown in FIG. 2), while the ammonia source is delayed in turn-on and supplied in a pulse mode. For example, the ammonia source is turned on after the Al-source has been on for 3 seconds. These 3 seconds of Al-deposition can be viewed as the process of forming Al nuclei NO. Then the ammonia source is in an on/off pulsation mode with the on/off time being 2 and 1 seconds, respectively. The ammonia pulses can be on/off of 1 and 2 seconds, or 2 and 2 seconds, respectively. The on/off time ratio of the ammonia source can be in the range of 1:2 to 2:1 in each on/off cycle, the on time and off time may or may not be the same in all the cycles and are in the range of 1-4 seconds, respectively. The optimal ammonia on/off time periods depend on the epitaxial growth systems and can be optimized accordingly for different growth systems. In principle, one ammonia on/off time period should not be too long, for example, not longer than 6 seconds. This is to avoid the nitridation of the surface area 101 during the growth of AlN nuclei N1. The growth can be repeated for many cycles, for example, 8-30 cycles to reach the targeted nominal thickness of the AlN nuclei N1.

As mentioned previously, the initiation of AlN nuclei N1 (converting Al nuclei N0 into AlN nuclei) is optionally done at temperatures in the range of 800-950° C. The temperature for continuous growth of AlN nuclei N1 can be extended up to ~1300° C. The initiation and growth of N1 can be done at a constant temperature, or can be done at temperatures ramping up from ~850 up to ~1300° C. with ramp rate 1-3° C./s.

The ammonia flow rate of forming AlN nuclei N1 needs to be small, to keep ammonia/Al molar flow rate ratio (herein defined as V/III ratio) small when both ammonia and Al source (e.g., TMA) are turned on. The optional V/III ratio can be in the range of 10-800 such as 50-700, or 100-500. For example, when the Al source molar flow rate is 4.4 μmole/min, the ammonia flow rate can be selected from 4-80 sccm, giving a V/III ratio in the range of ~40-800. The small V/III ratio and ammonia pulse supply scheme are important to grow AlN nuclei N1 while maintain surface area 101 as sapphire surface, or ensure surface area 101 not to be significantly converted into AlN.

Figure 1D:
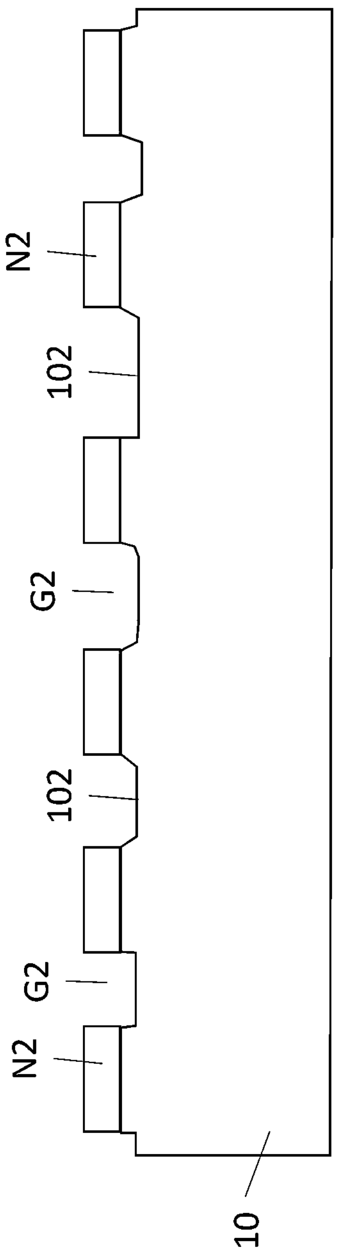
FIG. 1D illustrates a process to enlarge the AlN nuclei into AlN nucleation islands and etch the preserved sapphire surface shown in FIG. 1C.
Figure 3:
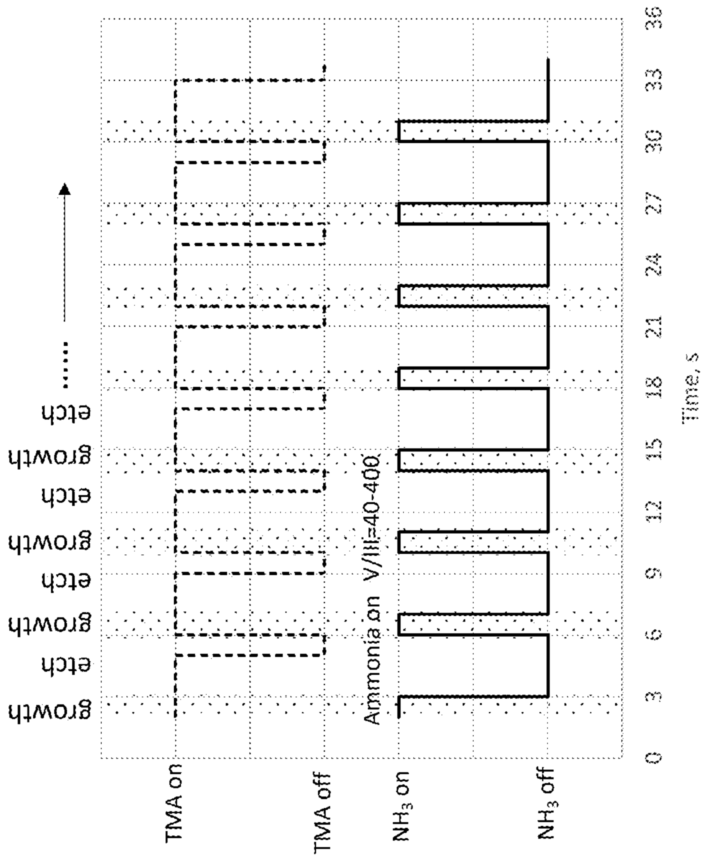
FIG. 3 illustrates an ammonia and Al-source (TMA) supply scheme for AlN nucleus growth and sapphire surface etch.

The second step s2 is illustrated in FIG. 1D, in step s2 the AlN nuclei N1 are turned into AlN nucleation islands N2, via growth and merge of AlN nuclei N1, and simultaneously the uncovered surface area 101 is etched into the substrate to form depressions 102 which may contain discrete depressions and depression networks. The targeted nominal thickness of N2 is in the range of 20-40 nm, for example, 25-35 nm. The areal density of AlN nucleation islands N2 is about $10^9$-$10^{10}$ $cm^{-2}$, of lateral size in the range of 20-100 nm. The temperature for N2 formation optionally is in the range of 1300-1450° C. And the source supply scheme can be similar to that of N1 formation, namely, with continuous Al-source supply and pulsed ammonia supply. However, the Al-source supply can also be in pulse mode, an example of this is shown in FIG. 3. As seen, s2 can include multiple periodic growth/etch sessions. During the growth sessions, both ammonia and Al-source are turned on. An etch session includes a period of time when Al-source is on and ammonia is off and a period of time when both Al-source and ammonia are off In this exemplary plot shown in FIG. 3, a growth session lasts for 1 second (TMA and $NH_3$ both on) and an etch session lasts for 3 seconds where the first two seconds are for molten Al to etch the surface area 101 forming depressions 102 (TMA on and $NH_3$ off) and the last one second is to help clean the etched surface (TMA and $NH_3$ both off). To reach the targeted nominal thickness of the AlN nucleation islands N2, these growth/etch sessions can be repeatedly performed for about 300 cycles, for example, 315-360 cycles. The nominal growth rate of AlN nucleation islands N2 is optionally in the range of 0.2-0.4 Å/s. When both ammonia and Al source are turned on, the V/III ratio is in the range of 40-400. For example, when the Al source molar flow rate is 8.8 mole/min, the ammonia flow rate can be 20 sccm, giving a V/III ratio ~100.

At these temperatures (1300-1450° C.), molten Al (with the absence or deficiency of ammonia and oxygen) can attack and etch the previously preserved surface area 101 and turns it into depressions 102 as shown in FIG. 1D. This etch effect, together with the growth of AlN nuclei N1 into AlN nucleation islands N2, makes gaps G1 grow deeper and turn into gaps G2. The etch depth into sapphire substrate surface can be as deep as a few tens of nanometers, for example, in the range of 20-100 or 40-60 nm, which also is the depth of the depressions 102. The so-formed depressions on the surface of the substrate can be of submicron size such as 20-100 nm. The depressions may contain discrete depressions or may form depression networks. For a depression network, the size is referred to the cross-sectional size of the connecting channels of the depression network. The mechanism of this etch effect is that at very high temperatures, such as 1300-1450° C., with the absence or deficiency of ammonia and oxygen, molten Al will reduce sapphire ($Al_2O_3$) into volatile $Al_2O$.

According to another aspect of the present disclosure, the presence of elements carbon (C) and silicon (Si) can enhance the sapphire surface etch effect. This is because that at these elevated temperatures (1300-1450° C.), Si and C can reduce $Al_2O_3$ and form volatile $Al_2O$, SiO and CO. In one embodiment of the present disclosure, a wafer carrier is coated with polycrystalline SiC, and the SiC coating can decompose at these temperatures (1300-1450° C.), providing C and Si elements to help molten Al to etch sapphire surface. In another embodiment, C elements can be provided via carbon-containing vapors such as trimethylgallium (TMG), trimethylindium (TMIn), methane ($CH_4$), ethane ($C_2H_6$), propane ($C_3H_8$), et al. These vapors of selection are due to the fact that they can provide carbon without incorporating other elements into the AlN template layer at the etch temperatures (e.g., 1300-1450° C.). In yet another embodiment, Si elements can be provided via Si-containing vapors such as silane ($SiH_4$), disilane ($Si_2H_6$) et al. When providing Si and C via silane, disilane, methane, ethane and propane during step s2 for growth of AlN nucleation islands N2, the molar flow rate ratio of Si (or C) to that of Al is preferred to be in the range of ~0.01-0.1, for example, 0.02-0.09. This process will usually result in Si (or C) incorporation into the AlN template layer in the vicinity of the substrate surface, with measurable concentration in the range of $\sim 1.0\times10^{20}$-$5.0\times10^{21}$ $cm^{-3}$, for example, $2.0\times10^{20}$-$3.0\times10^{21}$ $cm^{-3}$.

Figure 1E:
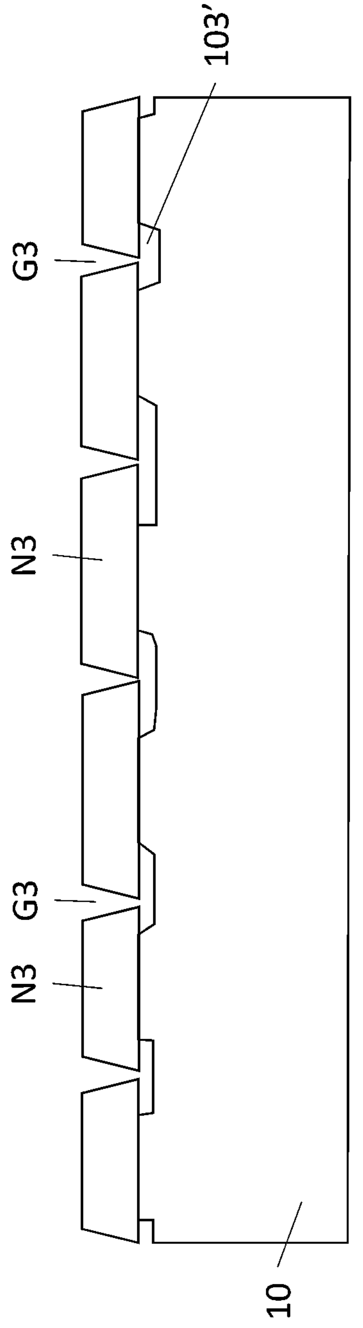
FIG. 1E illustrates a process to grow and coalesce the enlarged nuclei shown in FIG. 1D into a continuous film.
Figure 1F:
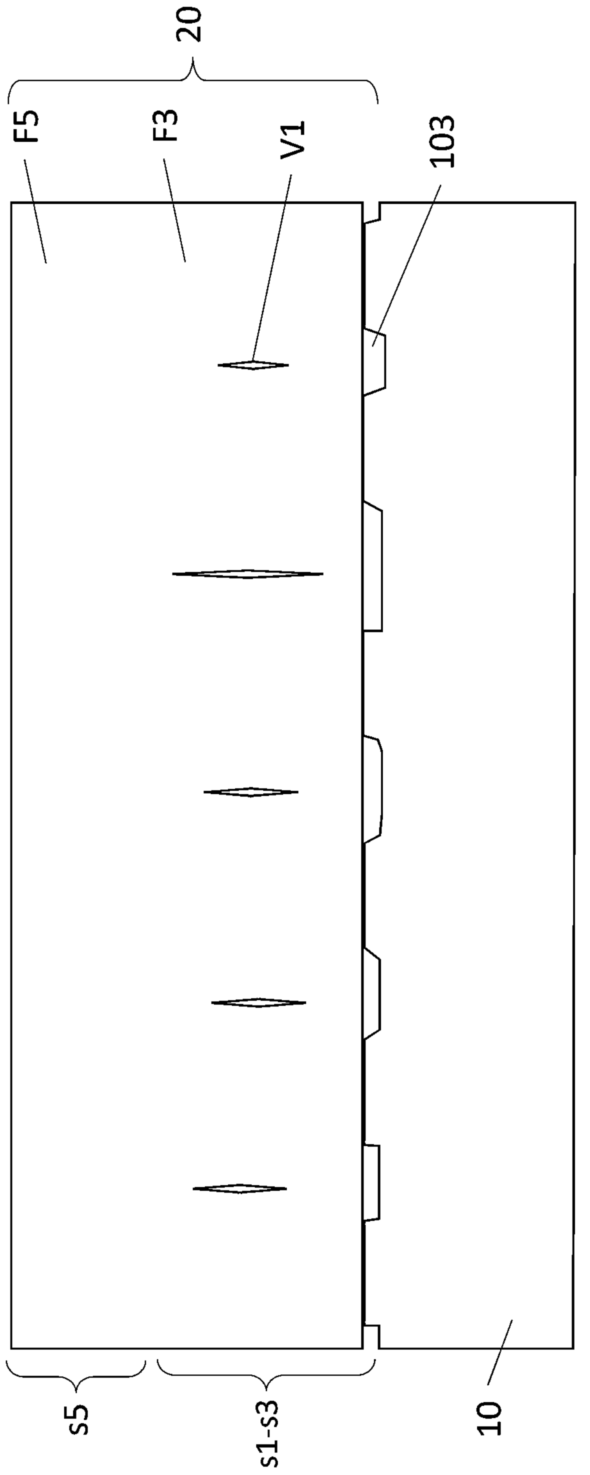
FIG. 1F illustrates a first set of voids formation as a result of the full coalescence of the AlN film shown in FIG. 1E.

The third step s3 is to coalesce the AlN nucleation islands N2, which is illustrated in FIGS. 1E and 1F. In s3, growth conditions favoring two-dimensional growth are applied to enhance lateral growth of AlN nucleation islands N2, and turn N2 into coalescing islands N3 as shown in FIG. 1E. The growth conditions favoring two-dimensional growth of AlN usually include low V/III ratios, high growth temperatures and low growth pressures (while the growth conditions favoring three-dimensional growth usually include high V/III ratios, high growth pressures and, and low growth temperatures). As Al adatoms have limited surface mobility, during the initial stage of step s3, the growth crystal plane normal to the vertical direction tends to shrink and the growth planes parallel to the vertical direction tend to enlarge/incline, leading to formation of the coalescing islands N3 with tilted side facets, which have acute inclination angle to the substrate surface. During the formation of coalescing islands N3, gaps G2 are turned into gaps G3 and unsealed depressions 103'.

As the two-dimensional growth conditions continue, closure of gaps G3 will take place, with the possibility to form a first set of voids V1. This is illustrated in FIG. 1F. Note that voids V1 may also vanish depending on the coalescence quality. Upon the accomplishment of step s3, the coalescing islands N3 finally coalesce into a continuous AlN film F3, depressions 102 (also depressions 103') are turned into sealed depressions 103 formed at the surface of substrate and possibly a first set of voids V1 embedded within AlN film F3 are also formed. Like depressions 102, sealed depressions 103 may contain discrete depressions and depression networks, having a lateral size and a vertical dimension in the range of 20-100 nm and an areal density in the range of $\sim 1.0\times10^{9}$-$2.0\times10^{10}$ $cm^{-2}$. For a depression networks, the lateral size is referred to a cross-sectional dimension of the connecting channels of the depression network.

The coalescence process can be monitored by in-situ reflectance measurement, which will be elaborated later on. The nominal thickness and growth rate of AlN film F3 are in the range of 300-600 nm and 3.0-6.0 Å/s, respectively, with a V/III ratio being in the range of 30-300. The growth temperature and pressure can be 1320-1420° C. and 75-200 mbar, respectively. For example, in one embodiment, the growth pressure and temperature of 150 mbar and 1380° C. are respectively employed for the growth step s3, targeting for a nominal thickness of 450 nm for the AlN film F3, using an Al source molar flow rate of ~105 mole/min and ammonia flow rate of 200 sccm (V/III ratio ~85). In another embodiment, the growth pressure and temperature of 100 mbar and 1340° C. are respectively employed for the growth step s3, targeting for a nominal thickness of 500 nm for the AlN film F3, using an Al source molar flow rate of ~175 μmole/min and ammonia flow rate of 300 sccm (V/III ratio ~77). To further enhance two-dimensional growth, ammonia source can be supplied in a pulse mode, to reach even lower average V/III ratio for faster coalescence of coalescing islands N3. For example, during s3, Al source can be constantly on, while ammonia source can be turned off for 3 seconds after being on for every 5 seconds, i.e., ammonia pulse supply scheme is on/off for 5/3 seconds, respectively. In one embodiment, during step s3 the Al source TMA is constantly on with a molar flow rate of 105 mole/min, and the ammonia supply scheme is in pulse mode with on/off time being 5 and 3 seconds in each on/off cycle, respectively. The formation process of coalescing islands N3 may include 100-200 on/off cycles. When the ammonia is on, its flow rate is 600 sccm. This ammonia pulse supply results in an average V/III ratio ~159.

Optionally, upon the coalescence of AlN film F3, another growth step s5 can be performed to form another AlN layer F5 of thickness 1000-3000 nm on top of AlN film F3, under higher V/III ratio than that of AlN film F3. AlN film F3 and AlN layer F5 constitute an AlN template 20. In some embodiments, step s5 also favors AlN two-dimensional growth. In some other embodiments, step s5 can be performed in AlN three-dimensional growth mode. The growth pressure for AlN layer F5 can be 75-200 mbar, for example, 100 mbar. The growth temperature can be 1240-1400° C., or 1260-1380° C. The V/III ratio and growth rate can be in the range of 30-500 and 5-10 Å/s, respectively.

Figure 1G:
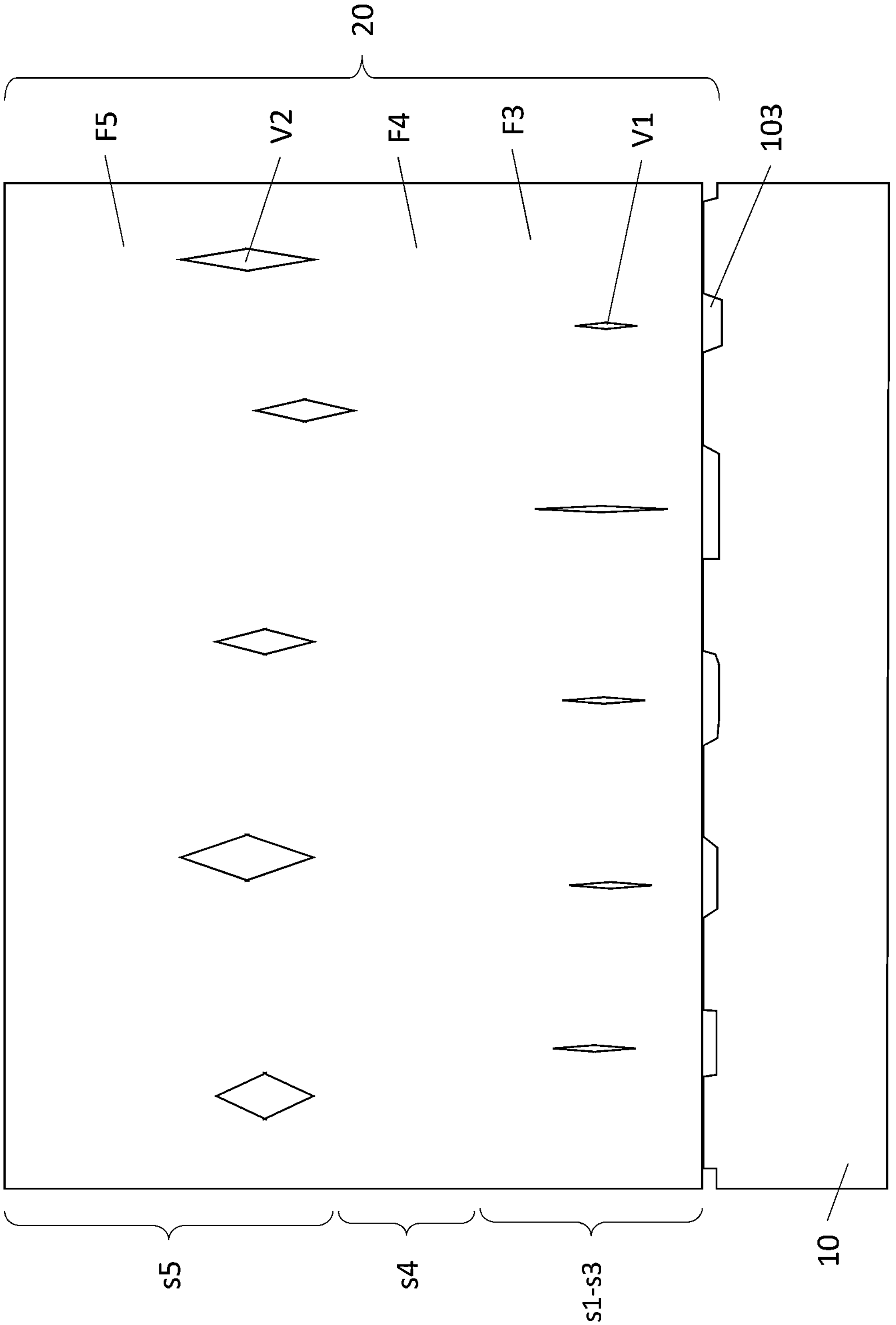
FIG. 1G illustrates a second set of voids formation in an AlN layer formed on the AlN layer shown in FIG. 1F.

In another embodiment, upon obtaining AlN film F3, optionally another step s4 to enhance AlN three-dimensional growth can be applied, so as to form an AlN layer F4 on top of AlN film F3 with roughened growth front. Then, a two-dimensional growth step s5 can be applied to form an AlN layer F5 on top of AlN layer F4. This will facilitate formation of a second set of voids V2 due to lateral two-dimensional growth of AlN on the roughened growth front of AlN layer F4. That is, optionally, as shown in FIG. 1G, AlN template 20 can include sealed depressions 103, AlN film F3 on substrate 10 with a first set of voids V1, AlN layer F4 on AlN film F3, and AlN layer F5 on AlN layer F4 with a second set of voids V2 formed at the interface between AlN layer F4 and AlN layer F5.

In order to form large voids V2, the V/III ratio used in s4 can be high and the growth temperature low. The nominal thickness and growth rate of AlN film F4 are in the range of 300-500 nm and 3.0-6.0 Å/s, respectively, with an optimal V/III ratio in the range of 700-3000, e.g., 1500. The optimal growth temperature can be 1220-1280° C. For example, when the Al source molar flow rate is 166 mole/min, the ammonia flow rate can be 5000 sccm, giving a V/III ratio ~1343. The Al source molar flow rate and the ammonia flow rate being epitaxial system dependent, nevertheless, can be selected according to the above outlined growth rate, growth temperature and V/III ratio ranges.

In the following, embodiments of forming AlN templates 20 will be described in details, using a semiconductor layer formation technology called metalorganic chemical vapor deposition (MOCVD). For AlN MOCVD, usually TMA and ammonia are used as aluminum and nitrogen sources, respectively. An MOCVD system may include a growth chamber (also called reactor), a source delivery system, an exhaust system, and a computer control system. The growth chamber is to house an epitaxial growth ambient for semiconductor layer formation, for example, to set up desirable vacuum levels/growth pressures and growth temperatures. The gas delivery system includes various metalorganic sources, ammonia source, purge and carrier gases such as hydrogen ($H_2$) and nitrogen ($N_2$), gas delivery tubing, and mass-flow controllers. The exhaust system at least includes a particle trap, a baratron and a dry pump to help the growth chamber to maintain desirable growth pressures. The computer control system sends instructions and reads feedbacks to maintain the MOCVD system's proper operation.

In one embodiment (embodiment A), an epi-ready c-plane sapphire wafer as substrate is loaded onto a SiC-coated graphite wafer carrier (also call susceptor), and the wafer carrier and sapphire substrate are then transferred into an MOCVD chamber. Then the chamber is pumped down to a vacuum level of a few millibars (mbar) before $H_2/N_2$ carrier and purge gases are introduced into the chamber to set up a proper growth pressure. The growth pressure used for AlN MOCVD in this specification is optionally in the range of 50-400 mbar, for example, 100 mbar. Then the wafer carrier and sapphire wafer substrate are heated up, (by e.g., radio-frequency (RF) electromagnetic waves), to desired temperatures with suitable ramp rate. To improve uniformity, the wafer carrier rotates in a constant rate such as 20 revolutions per minute (RPM).

Figure 2:
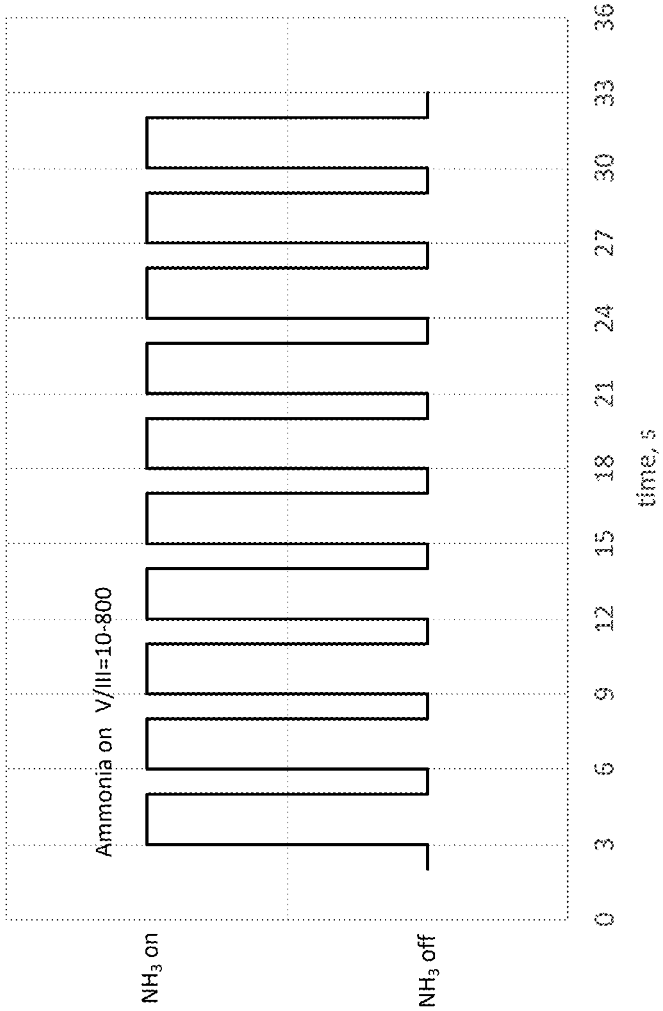
FIG. 2 illustrates an ammonia supply scheme for AlN nuclei formation and sapphire surface preservation on a sapphire substrate.

In embodiment A, the growth pressure is set up to be 100 mbar, and the wafer carrier and sapphire substrate are heated up to 880° C. with a temperature ramp rate of 3° C./s in $N_2$ and $H_2$ ambient. Upon reaching 880° C., metalorganic source TMA of molar flow rate of ~4.4 mole/min is introduced into the chamber for 3 seconds, to provide Al nuclei N0 on the sapphire substrate. Immediately after the formation of the Al nuclei NO, with the same temperature ramp rate of 3° C./s and heating up to a new targeted growth temperature of 1250° C., the TMA source stays on constantly with a flow rate of ~4.4 mole/min when ammonia pulses are introduced (as shown in FIG. 2) in a 2 s-on 1 s-off scheme. When the ammonia is on, its flow rate is 40 sccm. The TMA source and ammonia source will be both off after the ammonia has been delivered for 10-12 pulses. This process transforms the Al nuclei N0 into AlN nuclei N1 and helps AlN nuclei N1 grow in size and density. Once the temperature 1250° C. is reached, a new target temperature of 1340° C. is set (ramp rate 3° C./s), and TMA of a constant molar flow rate of ~10.5 mole/min is introduced into the chamber with ammonia pulses in a 1 s-on 2 s-off scheme. When the ammonia is on, its flow rate is 17 sccm. This process further helps AlN nuclei N1 grow in size and density. The TMA source and ammonia source will be both shut off after the ammonia has been delivered for 8-10 pulses. So far, the step s1 has been accomplished. The next temperature target is 1340° C., once reached, the step s2 will start. During s2, TMA of constant molar flow rate of ~8.8 mole/min is introduced into the chamber with ammonia pulses in a is-on 2 s-off scheme. When the ammonia is on, its flow rate is 19 sccm. Step s2 will be accomplished once the ammonia has been delivered for 315 pulses. Step s2 etches the exposed sapphire substrate (i.e., etching surface area 101 into depressions 102) and transforms AlN nuclei N1 into AlN nucleation islands N2. The SiC coating on the wafer carrier will decompose at this temperature (i.e., 1340° C., or >1300° C.) of s2, providing Si and C elements to help etch surface area 101 to form depressions 102 and gaps G2. When needed, additional Si or C can be added into the MOCVD chamber, to make sure the proper formation of gaps G2 in terms of density and size in the range of $10^9$-$10^{11}$ $cm^{-2}$ and 20-100 nm, respectively.

Figure 4:
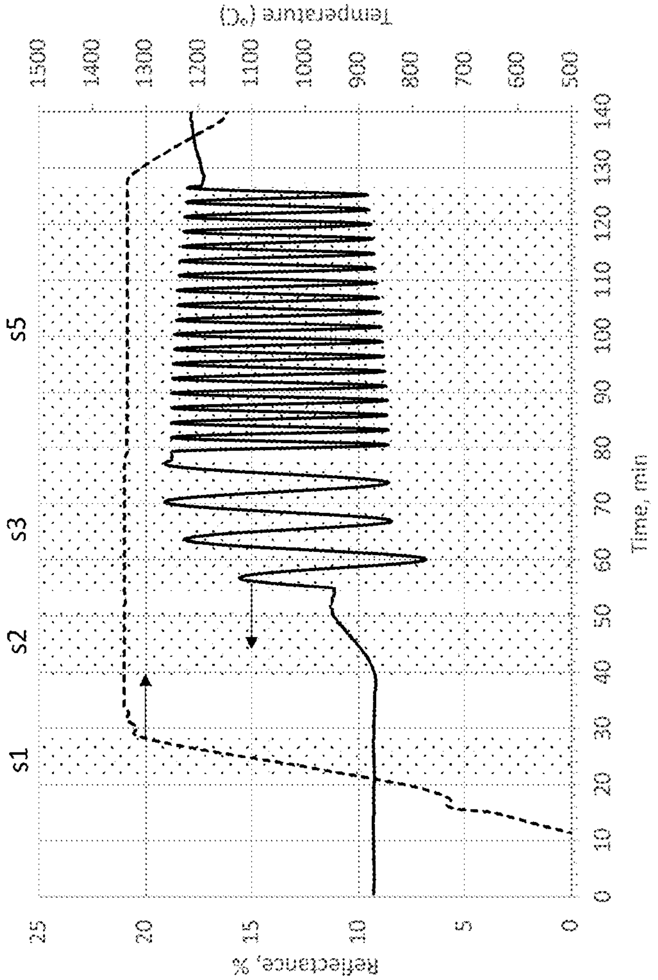
FIG. 4 shows light (633 nm) reflectance and susceptor temperature profiles for an AlN layer (e.g., seen in FIGS. 6A and 6B) formation on a sapphire substrate.

The growth temperature and the in-situ reflectance profiles for this embodiment are shown in FIG. 4, where AlN growth steps are highlighted by dotted areas. The reflectance is taken for a 633 nm laser beam, to indicate the growth rate and the surface smoothness of the AlN layer, while the growth temperature is measured by a thermal couple in the close vicinity of the wafer carrier. As seen, the step s1 for AlN Nuclei N1 formation has been performed during a temperature ramp, starting at temperature ~880° C. and finishing at ~1300° C. During s1, no noticeable change is observed in the reflectance curve, indicating that the nominal growth rate and thickness of AlN nuclei N1 are trivial and not measurable by the 633 nm laser reflectance. Indeed, small growth rate and nominal thickness are used for the growth of AlN nuclei N1, namely, in the range of 0.1-0.3 Å/s and 10.0-25.0 Å, respectively. The laser reflectance starts to change (increase) during the step s2. But the nominal growth rate for s2 is kept small too, in the range of 0.2-0.4 Å/s, for example, 0.3 Å/s. The growth temperature for s2 in this embodiment is kept constant at ~1340° C. During s2, AlN nuclei N1 grow into AlN nucleation islands N2, and etch depressions or gaps G2 are formed in the sapphire surface in-between islands N2. In order to facilitate the removal of etch by-products such as $Al_2O$, s2 is performed at a lower pressure of 75 mbar. And additional Si elements has been introduced via silane injection into the MOCVD chamber. The silane used is diluted in pure hydrogen of concentration about 100 parts per million (ppm). And the diluted silane flow rate used is 45 sccm, translating into a Si/Al molar flow ratio of 0.023 during the formation of AlN nucleation islands N2. In another embodiment, the diluted silane flowrate used is 180 sccm, translating into a Si/Al molar flow ratio of 0.092 during the formation of AlN nucleation islands N2.

At the same growth temperature, the growth pressure is raised to 150 mbar for the third growth step (s3). The TMA molar flow rate and ammonia flow rate are respectively ~105 μmole/min and 600 sccm. While the Al source TMA is constantly on, the ammonia source is supplied in an on/off 5 s/3 s pulse mode. Totally 315 ammonia pulses have been applied. As seen in FIG. 4, during s3, the reflectance curve quickly oscillates and the maximum amplitude monotonically increases. Each full oscillation corresponds to an AlN layer growth of ~150 nm. This means the growth rate is increased as compared to that of s2, and the AlN formed is getting smoother and smoother, meaning the coalescing islands N3 are merging and their coalescence is taking place.

Once the maximum amplitude of the reflectance spectrum saturated, a fully coalescent AlN film F3 is obtained. Sealed depressions 103 and possibly a first set of voids V1 can be formed during s3. As seen here, the so formed AlN film F3 contains ~3.3 full oscillations in the reflectance spectrum, corresponding to a thickness of ~495 nm.

To further improve the AlN layer quality, an additional AlN layer (F5) can be formed on the AlN film F3. This is obtained by performing another growth step of AlN, s5. For this, the growth temperature is reduced to ~1335° C., and the growth pressure is set back to 100 mbar, and the ammonia flow rate and TMA molar flow rate are respectively 250 sccm and 271 μmole/min (V/III ratio ~41). The so-formed additional AlN layer thickness is about 2.6 μm. It is noted that the growth conditions used in s5 should also facilitate two-dimensional growth. In some embodiments, during s5, the Al source TMA (e.g., of molar flow rate 271 μmole/min) is constantly on, and the ammonia source is supplied in a pulse mode with periodic alternative high/low ammonia flowrates, for example, the ammonia flowrate can respectively be 230 and 1000 sccm for 120 and 60 seconds, periodically.

Figure 6A:
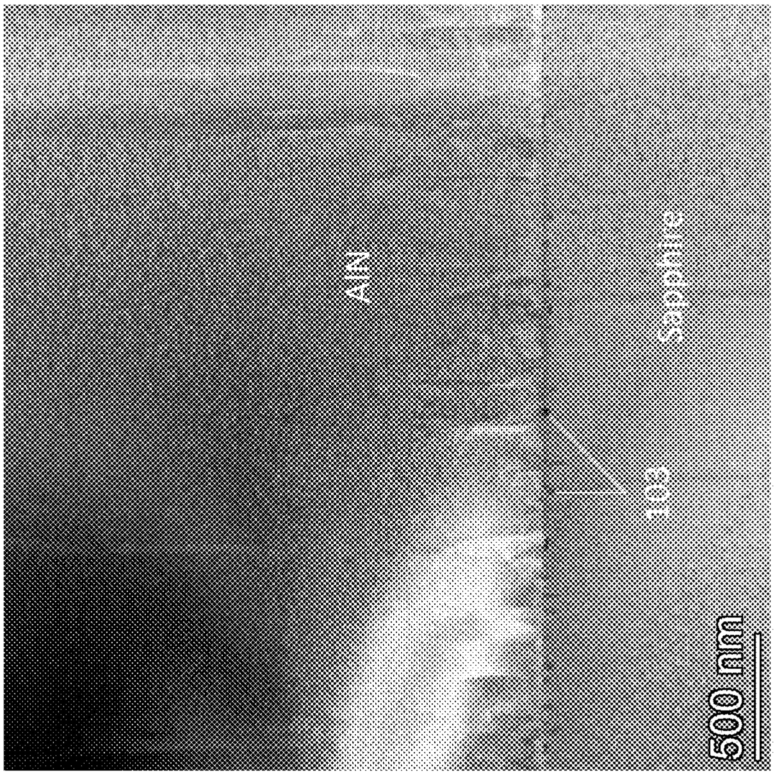
FIG. 6A Transmission electron microscope (TEM) cross-sectional image of an AlN layer formed on a sapphire substrate.
Figure 6B:
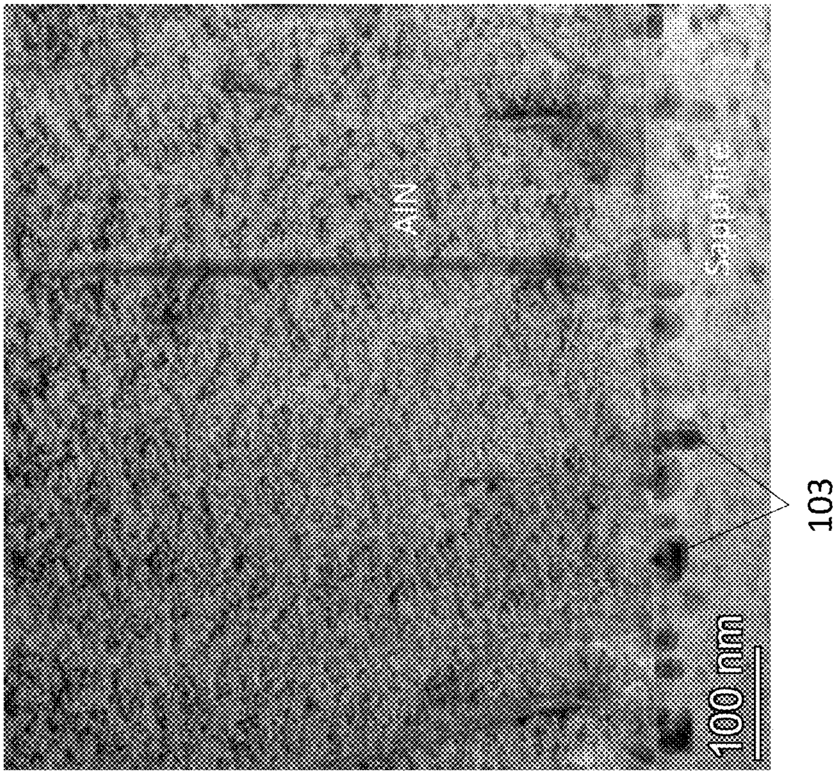
FIG. 6B Transmission electron microscope (TEM) cross-sectional image of an AlN layer formed on a sapphire substrate.

The AlN template layer 20 obtained in this embodiment with a total thickness about 2.8-3.1 μm is of high-quality and can be used as epitaxial growth template for UV LEDs. Features of the template, such as etch depressions in the sapphire substrate (sealed depressions 103) and the first set of voids V1 in the AlN layer can be revealed by cross-sectional transmission electron microscope (X-TEM) measurements. Some X-TEM micrographs of an AlN template on sapphire formed according to this embodiment are given in FIGS. 6A and 6B. Noted that the micrograph shown in FIG. 6B is of higher magnification, in order to have a better view at the AlN/sapphire interface. As seen, in the vicinity of the AlN/sapphire interface, many small darker dots exist on the sapphire side. This is due to the lack of substance there, resulting in less reflected or secondary electrons so as to form the dark contrast. Hence the darker dots at the interface indicate void formation in the sapphire surface area. These voids/depressions (sealed depressions 103) penetrating into the sapphire top surface are of high-density and of lateral and vertical dimensions of a few tens of nanometers (e.g., 20-100 nm observed). The void areal density observed in the FIGS. 6A and 6B are estimated to be ~$8.0\times10^{9}$-$2.0\times10^{10}$ $cm^{-2}$ assuming the TEM sample thickness being 150 nm. The areal density of sealed depressions 103 is related to (or, arguably equal to) the areal density of the AlN nucleation islands N2.

Figure 7:
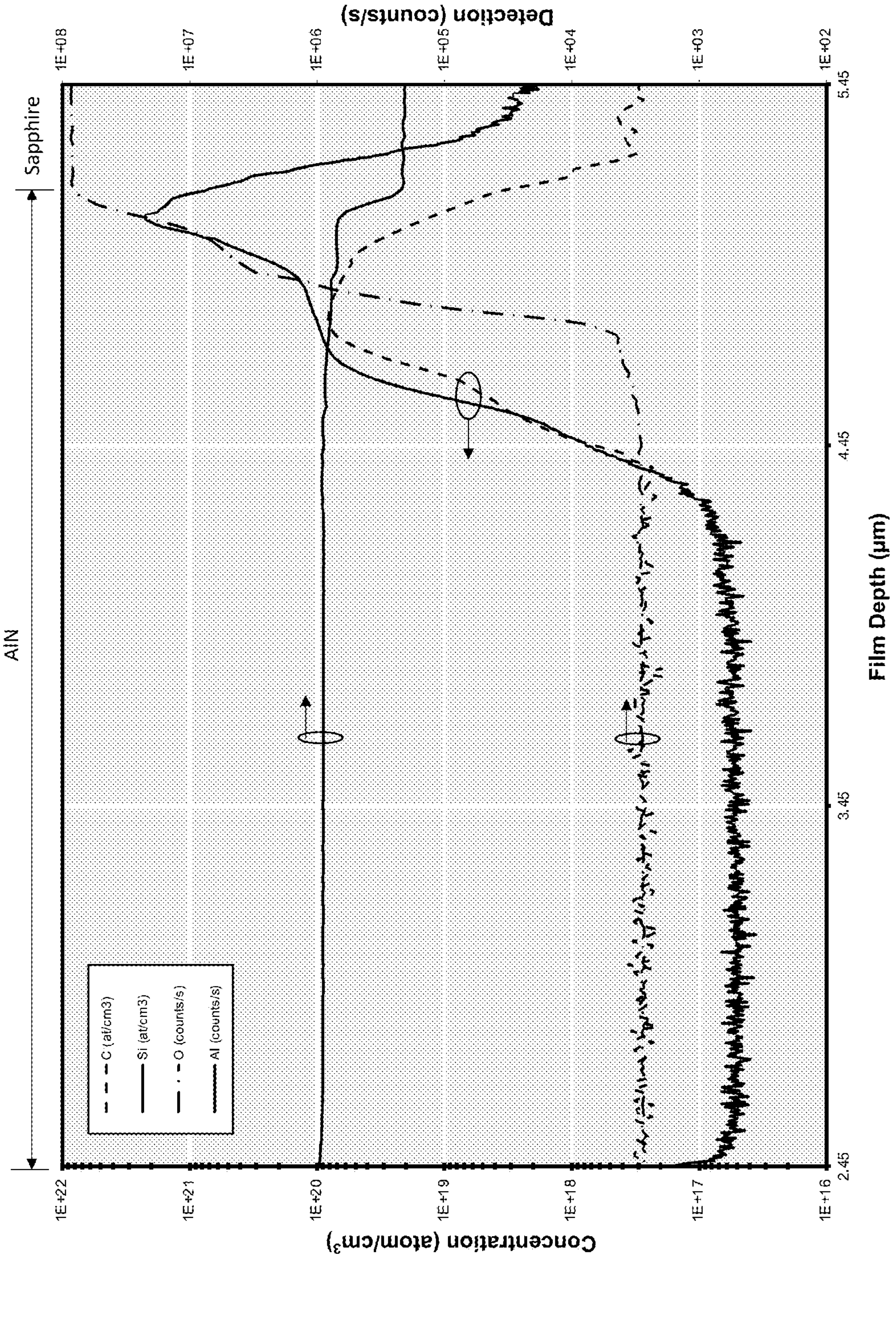
FIG. 7, Si and O concentration profiles in an AlN template grown on a sapphire substrate.

In FIG. 7, Si and oxygen (O) concentration profiles are plotted against the film thickness for the AlN template formed according to this embodiment. The impurity concentrations are measured by method of secondary-ion mass spectrometry (SIMS), which is a technique used to analyze the doping and composition of thin films by sputtering the surface of a specimen with a focused primary ion beam and collecting and analyzing ejected secondary ions. As shown, the AlN film thickness measured by SIMS is about 2.8 μm. The beginning of the O concentration curve plateau marks the AlN/sapphire interface. In the vicinity of the AlN/sapphire interface, a strong Si concentration peak exists, with measured Si concentration as high as ~$2.0\times10^{21}$ $cm^{-3}$. This Si peak, of full-width at half-concentration of 25 nm, is due to the intentionally introduced silane flow as well as the decomposed SiC coating of the wafer carrier during the growth step s2 in order to form the AlN nucleation islands N2. C (~$10^{20}$ $cm^{-3}$) and O impurities are also detected in the AlN layer within ~500 nm from the AlN/sapphire interface.

In this embodiment (A), depressions (voids) are formed in the sapphire substrate surface, however, there is no clear indication of a first set of voids V1 formed in the AlN template. In another embodiment B, a first set of voids V1 are to be formed in an AlN template, besides the formation of sealed depressions 103 in the sapphire substrate. The general formation process of the AlN template given by embodiment B is similar to that of embodiment A, except that a short portion of growth (s3') at the beginning of step s3 has to be favorable to three-dimensional growth.

In embodiment B, an epi-ready c-plane sapphire wafer as substrate is loaded onto a SiC-coated graphite wafer carrier, and the wafer carrier and sapphire substrate are then transferred into an MOCVD chamber. Then the chamber is pumped down to a vacuum level of a few millibars (mbar) before $H_2/N_2$ carrier and purge gases are introduced into the chamber to set up a proper growth pressure. Here the pressure is set to be 100 mbar, and the wafer carrier and sapphire substrate are heated up to 880° C. with a temperature ramp rate of 3° C./s, in $N_2$ and $H_2$ ambient. Upon reaching 880° C., metalorganic source TMA of molar flow rate of ~4.4 mole/min is introduced into the chamber for 3 seconds, to provide Al nuclei N0 on the sapphire substrate. Immediately after formation of the Al nuclei NO, with the same temperature ramp rate of 3° C./s and heating up to a new targeted growth temperature of 1250° C., the TMA source stays on constantly with a flow rate of ~4.4 mole/min when ammonia pulses are introduced (as shown in FIG. 2) in a 2 s-on is-off scheme. When the ammonia is on, its flow rate is 40 sccm. The TMA source and ammonia source will be both off after the ammonia has been delivered for 10 pulses. This process transforms the Al nuclei N0 into AlN nuclei N1 and helps AlN nuclei N1 grow in size and density. Once the temperature is reached 1250° C., a new target temperature of 1415° C. is set (ramp rate 3° C./s), and TMA of a constant molar flow rate of ~10.5 mole/min is introduced into the chamber with ammonia pulses in a is-on 2 s-off scheme. When the ammonia is on, its flow rate is 17 sccm. This process further helps AlN nuclei N1 to grow in size and density. The TMA source and ammonia source will be both shut off after the ammonia has been delivered for 8 pulses. So far, the step s1 has been accomplished. The next temperature target is 1415° C., once reached, the step s2 will start. During s2, TMA of constant molar flow rate of ~8.8 mole/min is introduced into the chamber with ammonia pulses in a 1s-on 2 s-off scheme. When the ammonia is on, its flow rate is 19 sccm. Step s2 will be accomplished once the ammonia has been delivered for 315 pulses. Step s2 etches the exposed sapphire substrate and transforms AlN nuclei N1 into AlN nucleation islands N2. As the growth temperature of s2 in this embodiment is very high (1415° C.), the SiC coating decomposition of the wafer carrier can be expected to be more intense, delivering more Si and C elements to enhance the sapphire surface etch effect. There is no silane introduction into the MOCVD chamber during this s2 growth step.

Figure 5A:
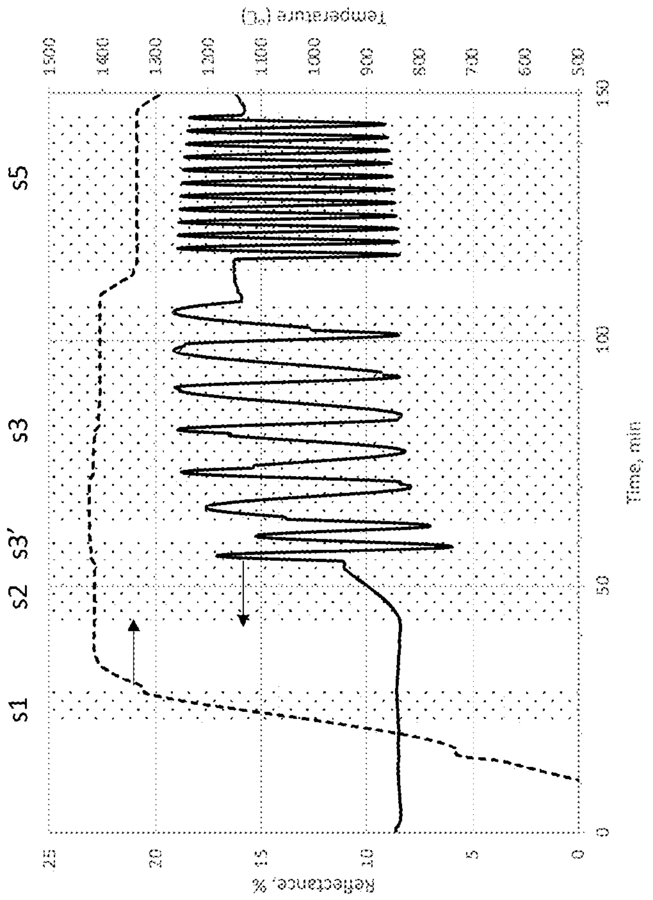
FIG. 5A shows light (633 nm) reflectance and susceptor temperature profiles for an AlN layer (e.g., seen in FIG. 8A) formation on a sapphire substrate.

The growth temperature and the in-situ reflectance profiles for this embodiment are shown in FIG. 5A. As seen, the step s1 of AlN Nuclei formation has been performed during a temperature ramp, starting at temperature ~880° C. and finishing at ~1300° C. During s1, no noticeable change is observed for the reflectance curve, indicating that the nominal growth rate and thickness of AlN nuclei N1 are trivial and not measurable by laser reflectance. Indeed, small growth rate and nominal thickness are used for the growth of AlN nuclei N1, namely, in the range of 0.1-0.3 Å/s and 10.0-25.0 Å, respectively. The laser reflectance starts to change during the step s2. But the nominal growth rate for s2 is kept small too, in the range of 0.2-0.4 Å/s, for example, 0.3 Å/s. The growth temperature for s2 in this embodiment is kept constant at ~1415° C. During s2, AlN nuclei N1 grow into AlN nucleation islands N2, and etch depressions or gaps G2 are formed in the sapphire surface in-between islands N2. In order to facilitate the removal of etch by-products such as $Al_2O$, s2 is performed at a lower pressure of 75 mbar.

Then the growth temperature and pressure are slightly raised to 1425° C. and 150 mbar for the third growth step (including s3' and s3), respectively. First, a short growth step s3' is performed under growth conditions favoring three-dimensional growth (e.g., high growth pressure of 150 mabr and high ammonia flow of 1000 sccm), for a nominal AlN thickness ~225 nm (corresponding to ~1.5 oscillation period). The TMA molar flow rate and ammonia flow rate are respectively ~219 μmole/min and 1000 sccm. Step s3' is to grow AlN nucleation islands N2 into coalescing islands N3, with more roughened growth front. This can be revealed by the reduction of the reflectance observed in s3' in FIG. 5A. Following s3', growth step s3 favoring two-dimensional growth is performed, where the ammonia flow rate is reduced to ~200 sccm (to enhance two-dimensional growth) and TMA molar flow rate to 175 mole/min. Upon the accomplishment of s3 the coalescing islands N3 will coalesce and form a first set of voids V1. As seen from the reflectance profile in FIG. 5A, during s3, the reflectance starts to recover to its full saturated amplitude within about 7 oscillation periods (~1.05 μm-thick AlN). This means that with this AlN layer grown in s3, an AlN layer is obtained with smooth surface.

To further improve the AlN layer quality, an additional AlN layer can be formed. This is obtained by performing another growth step of AlN, s5. For this, the growth temperature is reduced to ~1330° C., and the growth pressure is set back to 100 mbar, and the ammonia flow rate and TMA molar flow rate are respectively 250 sccm and 271 mole/min, with a V/III ratio ~41 to favor two-dimensional growth mode. The so-formed additional AlN layer thickness is about 1.65 m.

Figure 8B:
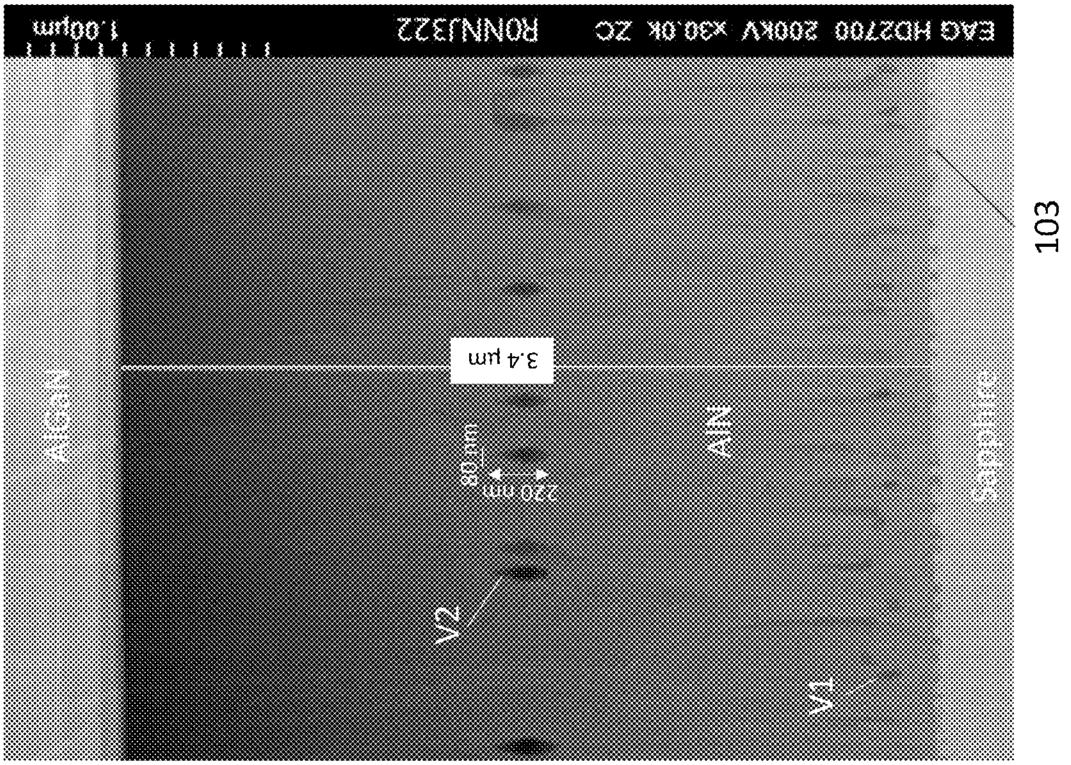
FIG. 8B Transmission electron microscope (TEM) cross-sectional image of an AlN layer formed on a sapphire substrate.
Figure 8A:
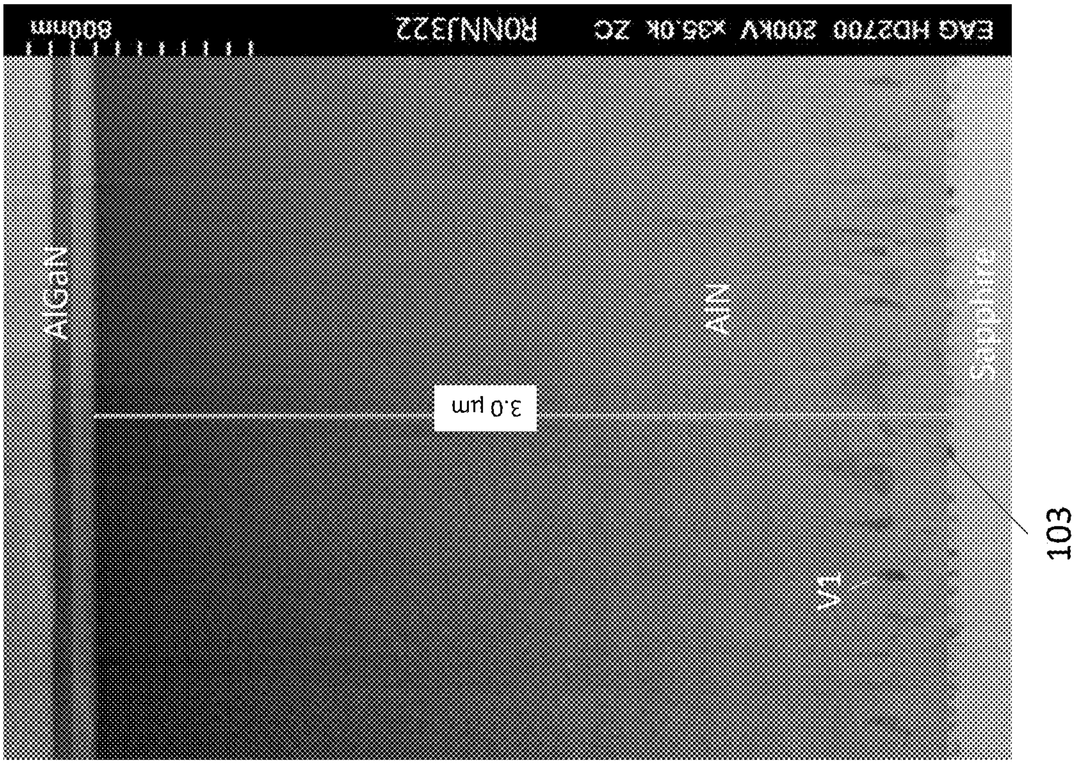
FIG. 8A Transmission electron microscope (TEM) cross-sectional image of an AlN layer formed on a sapphire substrate.

An X-TEM micrograph of an AlN template on sapphire formed according to this embodiment is given in FIG. 8A. As seen, penetrating into the sapphire top surface or within its close vicinity, there exist high-density sealed depressions 103, mostly containing voids of lateral and vertical dimensions of a few tens of nanometers such as 20-100 nm. At places ~100-300 nm away from the sapphire top surface, a first set of voids V1 are formed and revealed. From FIG. 8A, the areal densities of sealed depressions 103 and voids V1 are estimated to be $\sim 1.0\times10^{10}$ and $\sim 6.7\times10^{9}$ $cm^{-2}$, respectively, assuming the TEM sample thickness being 150 nm. The areal densities of sealed depressions 103 and voids V1 are implications/reflections of the areal densities of the AlN nucleation islands N2 and coalescing islands N3, respectively, experimentally observed to be in the range of $\sim 10^{9}$-$\sim 10^{10}$ $cm^{-2}$.

Figure 5B:
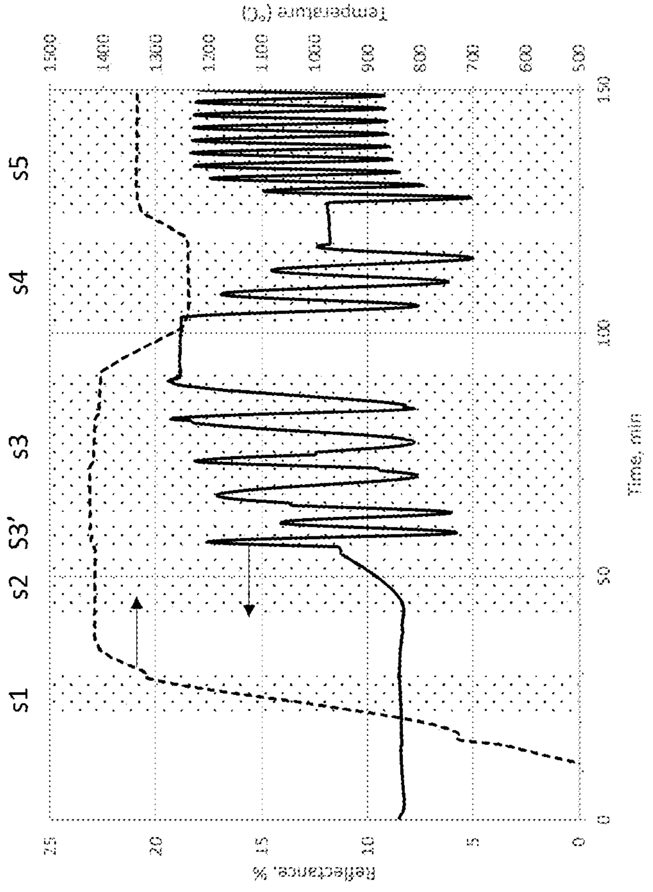
FIG. 5B shows light (633 nm) reflectance and susceptor temperature profiles for an AlN layer (e.g., seen in FIG. 8B) formation on a sapphire substrate.

In still another embodiment, embodiment C, the formation of an AlN template follows the similar or same steps as described in embodiment B, except that the time interval of s3 is shortened, so that the AlN layer formed in s3 is thinner, reduced from ~1.05 μm-thick down to ~0.75 μm-thick. This can be shown by the reflectance profile given in FIG. 5B, where only about 5 oscillation periods are presented for s3. Therefore, upon the accomplishment of s3, the AlN growth front is not yet fully coalesced. This can be revealed from the reflectance curve shown in FIG. 5B as the reflectance has barely reached its to its full saturated amplitude. The growth has been halted after s3 until the growth temperature is reduced to ~1240° C. Then a growth step s4 has been carried on for 15 minutes. The TMA molar flow rate and ammonia flow rate used in are 210 μmol/min and 5000 sccm, respectively. The growth pressure is kept at 100 mbar. This results in an AlN layer of nominal thickness ~450 nm. It is noted that the growth conditions applied in s4 favor three-dimensional growth of AlN. Then the growth temperature is increased to ~1330° C. for the growth step s5, where the growth pressure, ammonia flow rate and TMA molar flow rate are 100 mbar, 250 sccm and 271 mole/min, respectively. Growth step s5 favors AlN two-dimensional growth. The so-formed AlN layer thickness in s5 is about 1.35 μm. Note that during s4, the reflectance amplitude steadily reduces, indicating three-dimensional growth taking place, but it quickly recovers once s5 starts because the AlN two-dimensional growth conditions apply. This means that the growth front gets rougher and rougher during s4, but the roughness can be quickly smoothened out as s5 progresses. The growth conditions used in s4 and s5 facilitate vertical (or three-dimensional) and horizontal (or two-dimensional) growth, respectively.

As a result of the shortened growth step s3 and the addition of growth step s4, a second set of voids V2 are produced. This can be seen in the X-TEM micrograph in FIG. 8B taken for an AlN template grown according to the teachings given by the embodiment C (total thickness ~3.4 μm). As seen, voids V2 have less density but larger size as compared to voids V1. The vertical and lateral dimensions of some voids V2 are about 200 and 80 nm, respectively. From FIG. 8B, the areal densities of sealed depressions 103, voids V1 and voids V2 are estimated to be $\sim 1.0\times10^{10}$, $\sim 6.7\times10^{9}$ and $\sim 2.4\times10^{9}$ $cm^{-2}$, respectively, assuming the TEM sample thickness being 150 nm. Roughly speaking, the density of voids V2 is about 25%-35% of that of voids V1, for example, being 30% of that of voids V1.

In still another embodiment, the formation of an AlN template follows the similar or same steps as described in embodiments A, B or C, except that the step s1 for formation of AlN nuclei N1 is carried out in a constant temperature instead of a ramping temperature, for example, s1 can be performed at 930° C. Or, s1 can be carried out in three different constant temperatures, for example, a first part, a second part and a third part of s1 can be carried out at 910, 1150 and 1250° C., respectively.

In still yet other embodiments, the formation of an AlN template follows the similar or same steps as described in embodiment B or C, except that the step s3' for formation of AlN coalescing island N3 is carried out for a thicker thickness, to target for larger voids V1. In one embodiment, the growth pressure and temperature of 200 mbar and 1425° C. are respectively employed for the growth step s3', targeting for a nominal thickness of 800 nm for the AlN coalescing islands N3, using an Al source molar flow rate of ~70 mole/min and ammonia flow rate of 1000 sccm (V/III ratio ~640). In another embodiment, the growth pressure and temperature of 200 mbar and 1260° C. are respectively employed for the growth step s3', targeting for a nominal thickness of 800 nm for the AlN coalescing islands N3, using an Al source molar flow rate of ~70 mole/min and ammonia flow rate of 1000 sccm (V/III ratio ~640). In these embodiments, the size of voids V1 may become larger.

The AlN templates so formed on sapphire substrates according to the present disclosure are of high quality and suitable for high-efficiency UV LEDs. Especially, the depressions (sealed depressions 103) formed in the sapphire surface and the voids (V1 and V2) formed in the AlN templates can reduce dislocation density hence improve UV LED efficiency and lifetime.

Figure 9:
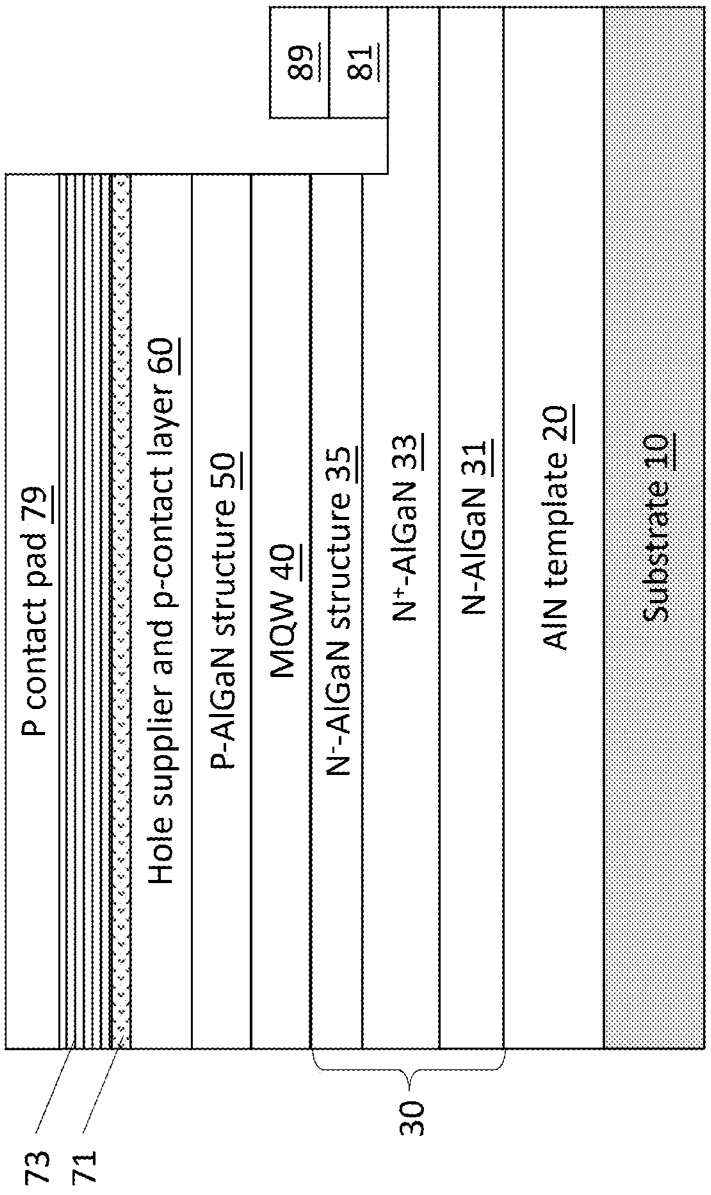
FIG. 9 illustrates a UV LED epitaxial layered structure according to an embodiment of the present invention.

Illustrated in FIG. 9 is a cross-sectional schematic view of a UV LED structure formed over a substrate 10 according to an embodiment of the present invention. Substrate 10 can be made from c-plane sapphire. Formed over substrate 10 is an AlN template 20, which can be made of a thick AlN layer, for example, with a thickness of 1.5-6.0 m to fully coalesce on the substrate 10. The formation of AlN template 20 can follow the embodiments given above. Even though not shown in FIG. 9, a strain management structure such as an Al-composition grading AlGaN layer or sets of AlN/AlGaN superlattices can be formed over template 20. Formed over template 20 is a thick n-AlGaN structure 30 for electron supply and n-type ohmic contact formation. Structure 30 may include a thick (2.0-5.0 μm such as 3.0 μm, $n=2.0\times10^{18}$-$5.0\times10^{18}$ $cm^{-3}$) n-type N—AlGaN layer 31 for current spreading, a heavily n-type doped (0.2-0.8 μm such as 0.60 μm, $n=8\times10^{18}$-$2\times10^{19}$ $cm^{-3}$) $N^{+}$—AlGaN layer 33 for MQW active-region polarization field screening, and a lightly doped $N^{-}$—AlGaN layer 35 (0.1-0.5 μm such as 0.3 μm, $n=2.5\times10^{17}$-$2\times10^{18}$ $cm^{-3}$) to reduce current crowding and prepare uniform current injection into the following $Al_bGa_{1-b}N/Al_wGa_{1-w}N$ MQW active-region 40. MQW 40 is made of alternatingly stacked n-$Al_bGa_{1-b}N$ barrier and $Al_wGa_{1-w}N$ well for a few times, for example, for 3-8 times. The barrier thickness is in the range of 8-16 nm, and the well thickness is 1.2-5.0 nm. The total thickness of MQW 40 is usually less than 200 nm, for example, being 75 nm, 100 nm, or 150 nm. The n-$Al_bGa_{1-b}N$ barrier and $Al_wGa_{1-w}N$ well may have an Al-composition in the range of 0.3-1.0, and 0.0-0.85, respectively, and the Al-composition difference of the barrier and well is at least 0.15, or so to ensure a barrier-well bandgap width difference ($\Delta E_g$) at least 400 meV to secure quantum confinement effect. Following MQW 40 is a p-type AlGaN structure 50. Structure 50 can be a p-AlGaN layer of uniform or varying Al-composition, or a p-AlGaN superlattice structure, or a p-AlGaN MQW structure, or a p-AlGaN multilayer structure serving as hole injecting and electron blocking layer. Structure 50 has enough Al-composition and modulation to allow for sufficient electron blocking and hole injection efficiencies. Further, structure 50 is also efficient in spreading hole current laterally. Formed on top of structure 50 is a hole supplier and p-contact layer 60, which can be a p-AlGaN layer with grading Al-content, or a p-AlGaN layer engineered according to U.S. Pat. No. 10,276,746, the content of which is herewith incorporated by reference in its entirety. Briefly, p-contact layer 60 can be a thin (0.6-10 nm), strained, and heavily acceptor-doped nitride layer (e.g. Mg-doped, or Mg and Si co-doped to a concentration about $10^{19}$-$10^{20}$ $cm^{-3}$ or more). For UVB/UVC LEDs (emissions from 200 nm-315 nm), p-contact layer 60 prefers to be a Mg-doped AlGaN layer with Al-composition larger than 0.7, or with Al-composition to be from 0.7 to 1.0. If MQW active-region 40 emits longer wavelength emissions, for example UVA emissions (315 nm-400 nm), or visible emissions, p-contact layer 60 can have less Al-composition. Formed on p-contact layer 60 is a p-ohmic contact 71, which optionally to be a p-ohmic contact and reflector as well. For example, layer 71 can be rhodium layer, or a palladium layer. Optionally, formed on p-ohmic contact 71 is a metal reflector layer 73, which can be selected from metals Al, Rh, Pd, and Mo et al. Optionally, layer 73 is UV-reflective, for example, UVC-reflective, to maximize light extraction efficiency. Formed on layer 73 is a thick metal layer serving as p-contact pad 79, which can be made of a 2-8 μm gold layer or gold tin layer.

Also formed on N—AlGaN structure 30 is an n-ohmic contact 81, which can be made of thin metal layer stacks such as titanium/aluminum/titanium/gold (Ti/Al/Ti/Au) with respective layer thickness of 30-40/70-80/10-20/80-100 nm, for example 35/75/15/90 nm, or V/Al/V/Ag, V/Al/V/Au, and V/Al/Ti/Au, of respective thicknesses such as 20/60/20/100 nm. As seen from FIG. 9, n-ohmic contact 81 is preferred to be formed on the heavily n-type doped $N^{+}$—AlGaN layer 33. Overlying n-ohmic contact 81 is n-contact pad 89 made of a thick (2-10 μm) gold or gold tin layer.

During operation, electrons and holes will be injected into the MQW active-region 40 respectively from the N- and P—AlGaN structures 30 and 50, to radiatively recombine and emit UV light. The UV light will be imping on the interface between AlN template 20 and substrate 10. And the substrate surface features (sealed depressions 103) and voids (V1 and V2) in the AlN templates formed according to the teachings given in this disclosure will enhance light extraction efficiency.

AlN templates formed according to the present disclosure can also be used for GaN based electronic devices, such as Schottky diodes and field effect transistors. The substrate used can also be Si and SiC. For these applications, a GaN layer and an electronic device structure will be formed on the AlN template formed according to this disclosure. The high-quality crystal structure of the AlN template will improve the performance of the GaN based electronic devices formed thereon.

The present invention has used AlN, sapphire and UV LEDs as exemplary embodiments. However, it is to be understood that the scope of the present invention is not limited to the disclosed embodiments. On the contrary, it is intended to cover various modifications and similar arrangement or equivalents which can be obtained by a person skilled in the art without creative work or undue experimentation. The scope of the claims, therefore, should be accorded the broadest interpretation so as to encompass all such modifications and similar arrangements and equivalents.

What is claimed is:

1. A substrate structure for light emitting diodes, comprising:
- a substrate; and
- an AlN template layer formed on a surface of the substrate,
- wherein sealed depressions are formed on the surface of the substrate and covered by the AlN template layer, the sealed depressions contain discrete depressions and depression networks;
- wherein the sealed depressions have a lateral size in the range of 20-100 nm, a vertical dimension in the range of 20-100 nm, and a density in the range of $1.0\times10^{9}$-$2.0\times10^{10}$ $cm^{-2}$.

2. The substrate structure of claim 1, wherein the sealed depressions are formed by:
- forming discrete AlN nuclei on the surface of the substrate;
- growing the discrete AlN nuclei into discrete AlN nucleation islands and simultaneously etching, with the discrete AlN nuclei and the discrete AlN nucleation islands functioning as mask, the surface of the substrate to form depressions on the surface of the substrate; and
- under a growth condition favoring two-dimensional growth, growing the discrete AlN nucleation islands to coalesce the AlN nucleation islands, forming the AlN template layer and turning the depressions into the sealed depressions.

3. The substrate structure of claim 1, wherein the substrate is a sapphire substrate.

4. The substrate structure of claim 1, comprising a layer of a first set of voids in the AlN template layer at a distance of 100-300 nm away from the surface of the substrate.

5. The substrate structure of claim 4, wherein the first set of voids have a lateral size in the range of 10-100 nm, a vertical size in the range of 10-300 nm, and a density in the range of $10^9$-$10^{10}$ $cm^{-2}$.

6. The substrate structure of claim 4, comprising a layer of a second set of voids in the AlN template layer with the layer of the first set of voids located between the layer of the second set of voids and the substrate, wherein the second set of voids have a larger lateral size than that of the first set of voids, and a density of the second set of voids is 25%-35% of that of the first set of voids.

7. The substrate structure of claim 1, comprising a layer of voids in the AlN template layer, wherein the voids have a lateral size in the range of 30-100 nm, a vertical size in the range of 100-300 nm, and a density in the range of $5.0\times10^8$-$5.0\times10^9$ $cm^{-2}$.

8. The substrate structure of claim 1, wherein a layered region of the AlN template layer at an interface between the substrate and the AlN template layer contains Si with a Si concentration $1.0\times10^{20}$-$5.0\times10^{21}$ $cm^{-3}$, the layered region is of a thickness 20-40 nm.

9. The substrate structure of claim 1, wherein some of the sealed depressions are fully filled by AlN material from the AlN template layer, some of the sealed depressions are partially filled by AlN material from the AlN template layer and partially contain voids, and some of the sealed depressions fully contain voids.

10. A light emitting diode, comprising:

a substrate structure of claim 1, a n-type structure formed on the AlN template layer of the substrate structure;

an active region formed on the n-type structure, and a p-type structure formed on the active region.

11. A substrate structure for light emitting diodes, comprising:

a substrate; and an AlN template layer formed on a surface of the substrate, wherein sealed depressions are formed on the surface of the substrate and covered by the AlN template layer, the sealed depressions contain discrete depressions and depression networks;

wherein a layer of a first set of voids is formed in the AlN template layer at a distance of 100-300 nm away from the surface of the substrate;

wherein a layer of a second set of voids are formed in the AlN template layer with the layer of the first set of voids located between the layer of the second set of voids and the substrate, the second set of voids have a larger lateral size than that of the first set of voids, and a density of the second set of voids is 25%-35% of that of the first set of voids.

12. A substrate structure for light emitting diodes, comprising:

a substrate; and an AlN template layer formed on a surface of the substrate, wherein sealed depressions are formed on the surface of the substrate and covered by the AlN template layer, the sealed depressions contain discrete depressions and depression networks;

wherein a layered region of the AlN template layer at an interface between the substrate and the AlN template layer contains Si with a Si concentration $1.0\times10^{20}$-$5.0\times10^{21}$ $cm^{-3}$, the layered region is of a thickness 20-40 nm.

* * * * *